United States Patent
Shimoto et al.

(10) Patent No.: US 7,566,834 B2
(45) Date of Patent: *Jul. 28, 2009

(54) WIRING BOARD AND SEMICONDUCTOR PACKAGE USING THE SAME

(75) Inventors: Tadanori Shimoto, Tokyo (JP); Katsumi Kikuchi, Tokyo (JP); Hideya Murai, Tokyo (JP); Kazuhiro Baba, Tokyo (JP); Hirokazu Honda, Kanagawa (JP); Keiichiro Kata, Kanagawa (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/140,041

(22) Filed: Jun. 16, 2008

(65) Prior Publication Data

US 2008/0258283 A1    Oct. 23, 2008

(51) Int. Cl.
    *H05K 1/00* (2006.01)
(52) U.S. Cl. .................. 174/258; 174/250
(58) Field of Classification Search .......... 174/250, 174/258, 260, 262
    See application file for complete search history.

(56) References Cited

U.S. PATENT DOCUMENTS

| | | | |
|---|---|---|---|
| 5,374,469 A | | 12/1994 | Hino et al. |
| 5,538,789 A | * | 7/1996 | Capote et al. ............. 428/344 |
| 6,014,317 A | * | 1/2000 | Sylvester .................. 361/760 |
| 6,379,784 B1 | | 4/2002 | Yamamoto et al. |
| 6,392,164 B1 | * | 5/2002 | Iwaki et al. ................ 174/262 |
| 6,418,615 B1 | * | 7/2002 | Rokugawa et al. ......... 29/852 |
| 2005/0088833 A1 | | 4/2005 | Kikuchi et al. |

FOREIGN PATENT DOCUMENTS

| | | |
|---|---|---|
| JP | 11-163524 A | 6/1999 |
| JP | 2000-269647 A | 9/2000 |
| JP | 2002-185097 A | 6/2002 |
| JP | 2002-198462 A | 7/2002 |
| JP | 2003-347459 A | 12/2003 |
| JP | 2003-347737 A | 12/2003 |
| JP | 2004-119734 A | 4/2004 |

OTHER PUBLICATIONS

T. Koyama et al., "Package fabricated with all layers incorporating fine pitch IVH", Proceedings for the Eleventh Microelectronics Symposium, Oct. 2001, pp. 131-134.

* cited by examiner

*Primary Examiner*—Dean A. Reichard
*Assistant Examiner*—Yuriy Semenenko
(74) *Attorney, Agent, or Firm*—Sughrue Mion, PLLC

(57) ABSTRACT

A wiring board has a base insulating film. The base insulating film has a thickness of 20 to 100 μm and is made of a heat-resistant resin which has a glass-transition temperature of 150° C. or higher and which contains reinforcing fibers made of glass or aramid. The base insulating film has the following physical properties (1) to (6) when an elastic modulus at a temperature of T° C. is given as $D_T$ (GPa) and a breaking strength at a temperature of T° C. is given as $H_T$ (MPa).

(1) A coefficient of thermal expansion in the direction of thickness thereof is 90 ppm/K or less.
(2) $D_{23} \geq 5$
(3) $D_{150} \geq 2.5$
(4) $(D_{-65}/D_{150}) \leq 3.0$
(5) $H_{23} \geq 140$
(6) $(H_{-65}/H_{150}) \leq 2.3$

11 Claims, 13 Drawing Sheets

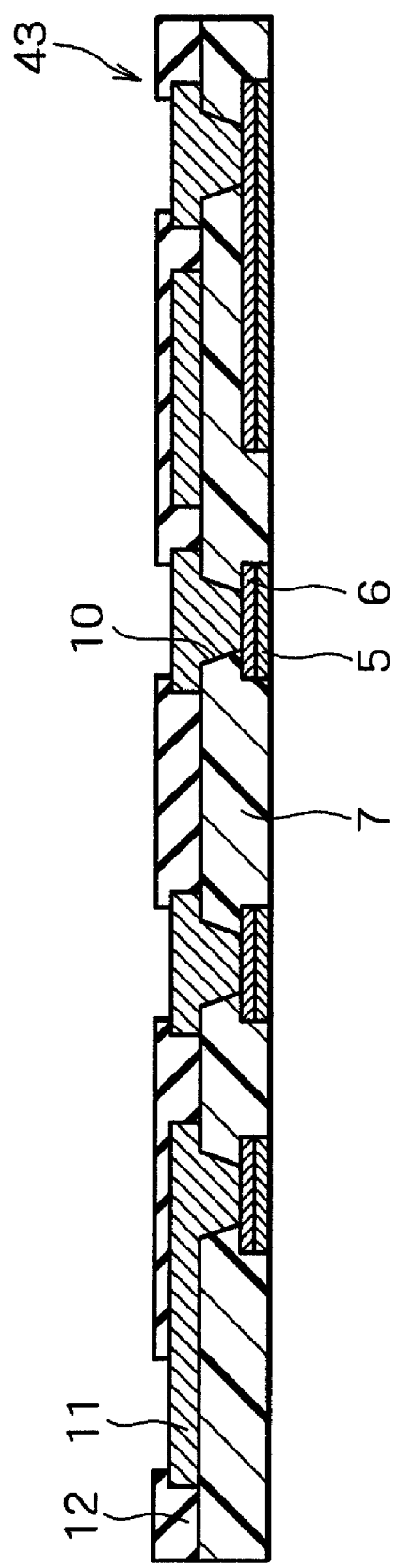

ical Symposium, pp. 131 to 134."
WIRING BOARD AND SEMICONDUCTOR PACKAGE USING THE SAME

CROSS-REFERENCE TO RELATED APPLICATIONS

This application is based upon and claims the benefit of priority from the prior parent patent application Ser. No. 11/125,158, filed on May 10, 2005, now U.S. Pat. No. 7,397,000, the entire contents of which is incorporated herein by reference.

BACKGROUND OF THE INVENTION

1. Field of the Invention

The present invention relates to a wiring board suitably used for semiconductor packages and modules and to a semiconductor package using the wiring board. More particularly, the invention relates to a wiring board, which is capable of including various devices, such as semiconductor devices, in high density, and driving these devices at high speed and which has improved reliability, and to a semiconductor package using the wiring board.

2. Description of the Related Art

In recent years, accompanying an increase in the number of terminals, their narrowed pitches, and increased operation speeds in semiconductor devices which result from the trend toward higher performance and greater functions of the devices, there has been growing demand that wiring boards for packaging provided with the semiconductor device attain higher-density finer wiring and higher-speed operation. As an example of conventional wiring boards for packaging which have found wide use, there are built-up printed boards which are a kind of multilayer printed wiring board.

FIG. 1 is a cross-sectional view showing a conventional built-up printed board. As shown in FIG. 1, this conventional built-up board is provided with a base core substrate 73 made of glass epoxy, and a penetrating through hole 71 having a diameter of about 300 μm is drilled in the base core substrate 73. A conductor wiring 72 is formed on both sides of the base core substrate 73, and an interlayer insulating film 75 is provided so as to cover the conductor wiring 72. Via holes 74 are formed in the interlayer insulating film 75 so as to be connected to the conductor wiring 72, and a conductor wiring 76 is provided on the surface of the interlayer insulating film 75 so as to be connected to the conductor wiring 72 through the via holes 74. The printed board may be provided with a multilayer wiring structure by further repeatedly providing interlayer insulating films in which via holes are formed and conductor wirings on the conductor wiring 76 as required.

However, the built-up printed board has an insufficient heat resistance due to the use of a glass epoxy printed board as the base core substrate 73, so that there is a problem deformations occur with the base core substrate 73, such as shrinkage, warpage and waviness through heat treatment performed for forming the interlayer insulating film 75. As a result, there exists a step of exposing a resist during the formation of the conductor wiring 76 through the patterning of a conductor layer (not shown), the positional accuracy of the exposure is significantly decreased, and hence it becomes difficult to form a high-density and fine wiring pattern on the interlayer insulating film 75. Further, it is necessary to provide land portions at the junctions of the conductor wiring 72 and the penetrating through holes 71 to securely connect them. Even though a wiring having provision for high-speed operation is designed on the built-up layer having the interlayer insulating film 75 and the conductor wiring 76, the control of impedance becomes difficult and loop inductance becomes high due to the presence of the land portions. Because of this, the operating speed of the entire built-up printed board is reduced, which brings about a problem that it is difficult to make the provision for high-speed operation.

To solve these problems caused by the penetrating through holes of the built-up printed board, a method for forming a printed board has been described in place of the method for drilling the penetrating through holes in a glass epoxy substrate in, for example, Japanese Patent Publication Laid-Open No. 2000-269647 and a reference "Proceedings For The Eleventh Microelectronics Symposium, pp. 131 to 134."

FIG. 2A to 2C are cross-sectional views showing this conventional printed board in the order of its manufacturing steps. To begin with, a prepreg 82, on which a predetermined conductor wiring 81 is formed, is prepared as shown in FIG. 2A. Then through holes 83 having a diameter of 150 to 200 μm are formed in the prepreg 82 by means of laser processing. Further, as shown in FIG. 2B, the through holes 83 are filled with a conductor paste 84. Still further, as shown in FIG. 2C, such a prepreg 82, that is, the prepreg 82 having the through holes 83 filled with the conductor paste 84 is fabricated plurally, and then the prepregs 82 thus fabricated are laminated together. At this time, the land pattern 86 of the conductor wiring 81 is connected to the through holes 83 of the adjacent prepreg, which allows a printed board 85 having no penetrating through hole to be fabricated.

However, in this conventional art, a positional accuracy in the lamination of the prepregs 82 is low, which brings about a problem that it is difficult to reduce the diameter of the land pattern 86. Therefore, it is difficult to implement high-density wiring, and the effects of improving the controllability of the impedance and of decreasing the loop inductance are insufficient. Furthermore, there is a problem that the reliability of the through hole connectivity after the lamination is poor.

To solve the number of problems, the inventors have developed a method for fabricating a wiring board through the formation of a wiring layer on a supporting structure such as a metal sheet and the subsequent removal of the supporting structure. The method is disclosed in Japanese Patent Publication Laid-Open No. 2002-198462 (page 8 and 11 and FIG. 17).

FIGS. 3A and 3B are cross-sectional views showing this conventional wiring board illustrated in the order of its manufacturing steps. To begin with, a supporting sheet 91 made of a metal sheet or the like is prepared as shown in FIG. 3A. A conductor wiring 92 is formed on the supporting sheet 91, an interlayer insulating film 93 is formed so as to cover the conductor wiring 92, and via holes 94 are formed in the interlayer insulating film 93 so as to be connected to the conductor wiring 92. Thereafter, a conductor wiring 95 is formed on the interlayer insulating film 93. The conductor wiring 95 is formed so as to be connected to the conductor wiring 92 through the via holes 94. By repeating the steps of forming the interlayer insulating film 93, the via holes 94, and the conductor wiring 95 as required, a multilayer wiring may be implemented. Then, as shown in FIG. 3B, a part of the supporting sheet 91 is removed by etching to expose the conductor wiring 92 and form a supporting structure 96, by which a wiring board 97 is fabricated.

At this time, as the interlayer insulating film 93, a single-layer film made of an insulating material, which has a film strength 70 MPa or more, an elongation percentage after breaking of 5% or more, a glass-transition temperature of 150° C. or more, and a coefficient of thermal expansion of 60 ppm or less, or a single-layer film made of an insulating material having an elastic modulus of 10 GPa or more, a coefficient of thermal expansion of 30 ppm or less, and a glass-transition temperature of 150° C. or more is used.

According to the technique, since the wiring board 97 has no penetrating through hole, the problems caused by the penetrating through holes can be solved, which allows a high-speed transmission to be designed. Also, since a high-heat-resistant metal sheet or the like is used as the supporting sheet 91, deformations, such as shrinkage, warpage, and waviness, do not occur in contrast to the case where the glass epoxy substrate is used, which makes it possible to implement a high-density fine wiring. Further, a wiring board having high strength can be obtained by determining the mechanical characteristics of the interlayer insulating film 93 as described above.

However, the conventional art has a problem described below. The wiring board 97 shown in FIG. 3B is extremely thin because of the absence of a base core substrate, but the wiring board 97 is capable of achieving a sufficient strength when fabricated initially through the determination of the mechanical characteristics of the interlayer insulating film 93 described above.

However, the wiring board 97 is generally provided with a large-area semiconductor device to form a semiconductor package, and then the semiconductor package is mounted to a mounting board such as a printed board. The semiconductor device generates heat during operation to be raised in temperature and ceases the heat during quiescent operation to be lowered in temperature. Because of this, during the semiconductor device operation, a thermal stress is applied to the wiring board 97 due to a difference in the coefficients of thermal expansion of the semiconductor device and the mounting board. Therefore, when the semiconductor device is operated repeatedly in a state that the semiconductor device is mounted to the wiring board 97 as described above, the thermal stress is repeatedly applied to the wiring board 97, so that cracks may occur in the interlayer insulating film 93 etc., of the wiring board 97. Because of this, there is a problem that it is impossible to secure reliability required for the wiring board and the semiconductor packages.

SUMMARY OF THE INVENTION

An object of the present invention is to provide a reliable wiring board, which is capable of including various devices such as a semiconductor device at high densities and which makes it possible to easily implement a high-speed transmission and a high-density fine wiring, and a semiconductor package using the wiring board.

The wiring board according to the present invention has a base insulating film having a thickness of 20 to 100 μm in which via holes are formed, a lower wiring which is formed on the under surface of the base insulating film and which is connected to the via holes, and an upper wiring which is formed on the base insulating film and which is connected to the lower wiring through the via holes. The base insulating film is made of a heat-resistant resin having a glass-transition temperature of 150° C. or more and containing reinforcing fiber made of glass or aramid, and has the following physical properties (1) to (6) when an elastic modulus at a temperature of T° C. is given as $D_T$ (GPa), and a breaking strength at a temperature of T° C. is given as $H_T$ (MPa).

(1) A coefficient of thermal expansion in the direction of thickness thereof is 90 ppm/K or less.
(2) $D_{23} \geqq 5$
(3) $D_{150} \geqq 2.5$
(4) $(D_{-65}/D_{150}) \leqq 3.0$
(5) $H_{23} \geqq 140$
(6) $(H_{-65}/H_{150}) \leqq 2.3$ With regard to a method for manufacturing a wiring board through the formation of a wiring layer on a supporting member such as a metal sheet and the subsequent removal of the supporting member, the present inventors have taken note of the fact that it is important to sufficiently secure a breaking strength and an elastic modulus in order to prevent cracks at a base insulating film when heat load is repeatedly applied by the operation of a semiconductor device. And the present inventors have already filed an application of a method for manufacturing a wiring board in which no crack occurs (Japanese Patent Application No. 2003-382418). However, as further study on the method progresses, it has been found that even when materials are used which meet requirements for sufficiently securing the breaking strength and the elastic modulus, that is, a requirement that the breaking strength at a temperature of 23° C. is 80 MPa or more, a requirement that when the breaking strength at a temperature of −65° C. is given as a, and the breaking strength at a temperature of 150° C. is given as b, the value of a ratio (a/b) is 4.5 or less, and a requirement that when the elastic modulus at a temperature of −65° C. is given as c, and the elastic modulus at a temperature of 150° C. is given as d, the value of a (c/d) is 4.7 or less, there are differences in the reliability of semiconductor devices obtained depending on their structures.

As a result of carrying out the study through the findings, it has been found that a wiring board having a higher reliability can be obtained by newly developing a base insulating film material made of a heat-resistant resin having a glass-transition temperature of 150° C. or higher which contains reinforcing fiber made of glass or aramid which meets the requirement for the breaking strength and the elastic modulus and which has the coefficient of thermal expansion in the direction of its thickness of 90 ppm/K or less. In addition, optimum requirements for the breaking strength and the elastic modulus have also been found.

As described above, by examining the materials made of the heat-resistant resin having a glass-transition temperature of 150° C. or more which contain the known reinforcing fiber made of the glass or aramid, such as a material (ABF-GX-1031 trade name) made by Ajinomoto Fine Techno Co., Inc. disclosed in Japanese Patent Application No. 2003-382418 and EA-541 (trade name) made by Shin-Kobe Electric Machinery Co., Ltd.) with regard to the coefficient of thermal expansion in the direction of thickness, it has been found that all of them have coefficients of thermal expansion in the direction of thickness of more than 90 ppm/K. As to these materials, it has been found that open failure occurs at via hole junctions when the via holes are formed immediately under electrode pads on which the semiconductor device is mounted, and then solder balls used for board mounting are provided immediately under the via holes, so that it has been shown that these materials are of inferior reliability when compared with the base insulating film material having the physical properties achieved by the invention.

In contrast, by using the insulating film having the physical properties achieved by the invention, strain stress can be reduced in the direction of thickness. Because of this, when heat load is repeatedly applied through the operation of the semiconductor device in the state that the via holes are formed immediately under the electrode pads on which the semiconductor is mounted, and then the solder balls used for board mounting are provided immediately under the via holes, it is possible to prevent the open failure at the via hole junctions, so that a more reliable semiconductor package can be obtained.

In addition, optimum values have been further examined with reference to other physical properties. That is, when the elastic modulus at a temperature of T° C. is given as $D_T$ (GPa), and the breaking strength at a temperature of T° C. is given as $H_T$ (MPa), the following inequalities are obtained.

$D_{23} \geqq 5$: base insulating films having a numeric value less than 5 are poor in transferability during semiconductor package assembly, and so on, so that the films have no practicality.

$D_{150} \geqq 2.5$: base insulating films having a numeric value less than 2.5 have insufficient wire bonding property, so that the films have no practicality. In order to satisfy the inequality, it is necessary to impregnate reinforcing fiber with a heat-resistant resin having a glass-transition temperature of at least 150° C.

$(D_{-65}/D_{150}) \leqq 3.0$: when this numeric value is large, variations in elastic modulus at low and high temperatures are large. Base insulating films having a numeric value larger than 3.0 develop trouble that semiconductor packages themselves suffer warping due to the application of strain stress to wiring boards through repeated heating and cooling during semiconductor package assembly, so that the films have no practicality.

$H_{23} \geqq 140$: base insulating films having a numeric value less than 140 are poor in ease of handling during the semiconductor package assembly of 20 μm thick wiring boards, so that the films have no practicality.

$(H_{-65}/H_{150}) \leqq 2.3$: when this numeric value is large, variations in breaking strengths at low and high temperatures are large. Base insulating films having a numeric value larger than 2.3 are particularly poor in mechanical strength at high temperatures, so that the base insulating films become cracked slightly in a step of assembling semiconductor packages such as wire bonding, and thus the films have no practicality.

As a result, it has been found that only when these factors have all been incorporated, it is possible to obtain reliable wiring boards.

When resins, that is, heat-resistant resins having a glass-transition temperature of 150° C. or more and particularly having a coefficient of thermal expansion in the direction of their thickness of about 60 ppm/K contain reinforcing fiber made of glass or aramid which has a coefficient of thermal expansion in the direction of its thickness of about 100 ppm/K, it is possible to adjust their coefficient of thermal expansion in the direction of their thickness to an optimum value while keeping the elastic modulus and breaking strength optimally.

At this time, when the reinforcing fiber is 10 μm or less in diameter, finer via holes having a favorable shape can be formed in a base insulating film by using not only carbon dioxide lasers but UV-YAG lasers having a short wavelength.

The wiring board according to the invention may have one or more wiring structure layers. Each of said wiring structure layers has: an intermediate wiring placed between said base insulating film and said upper wiring and connected to said lower wiring through said via holes; and an intermediate insulating film which is formed so as to cover said intermediate wiring and in which other via holes connecting said intermediate wiring to said upper wiring are formed. Therefore, desired high-density wiring boards can be realized.

Further, in these wiring boards, a concave portion is formed on the under surface of the base insulating film, and then in order to improve positional accuracy of the mounting of the semiconductor device having pads with a narrow pitch through the use of solder, it is preferable that the lower wiring be embedded in the concave portion, and the under surface of the lower wiring be located higher than the under surface of the base insulating layer by 0.5 to 10 μm.

Still further, when the under surface of the base insulating film and the under surface of the lower wiring are made coplanar, a margin for positional deviation can be obtained in the step of mounting the semiconductor device having pads with a narrow pitch through the use of gold bumps or the like, so that it is preferable in terms of improvement of connection reliability.

Also, the wiring board may have a protective film, which is formed under the base insulating film, covers a part of the lower wiring, and exposes the remainder. Furthermore, the wiring board may have a solder resist layer, which covers a part of the upper wiring and which exposes the remainder. Therefore, solder can be readily formed on the wiring board by printing or the like, and further when a semiconductor device having pads with a very narrow pitch is mounted, metal bumps, such as solder and gold, formed on the semiconductor device can be connected to the solder provided on the wiring board by fusing, so that it is possible to obtain a semiconductor package which has outstanding reliability of the bump connections.

The semiconductor package using the wiring board described above can be fabricated by connecting the semiconductor device to the lower wiring or the upper wiring. Furthermore, a connecting terminal can be provided which is used for connection to external device such as a circuit board.

The present invention can provide wiring boards which allowed for implementation of a high-speed transmission and high-density fine wiring by using an insulating film having low temperature dependence mechanical properties as a base insulating film, has no crack generation at the base insulating film, solder balls, or the like when heat load is repeatedly applied by the driving of a semiconductor device mounted, and has excellent reliability of via hole connections.

BRIEF DESCRIPTION OF THE DRAWINGS

FIG. 10 is a cross-sectional view showing a wiring board according to a fourth embodiment of the invention;

DETAILED DESCRIPTION OF THE PREFERRED EMBODIMENTS

Figure 4:
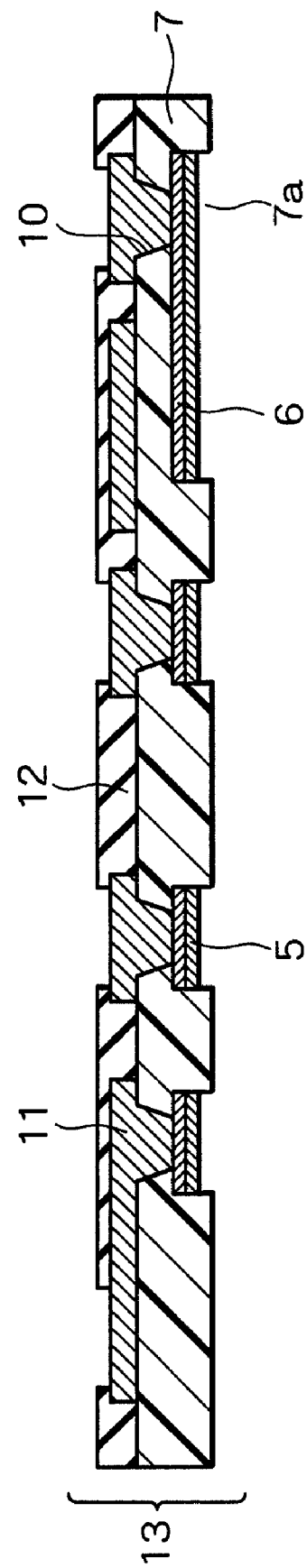
FIG. 4 is a cross-sectional view showing a wiring board according to a first embodiment of the present invention.
Figure 5:
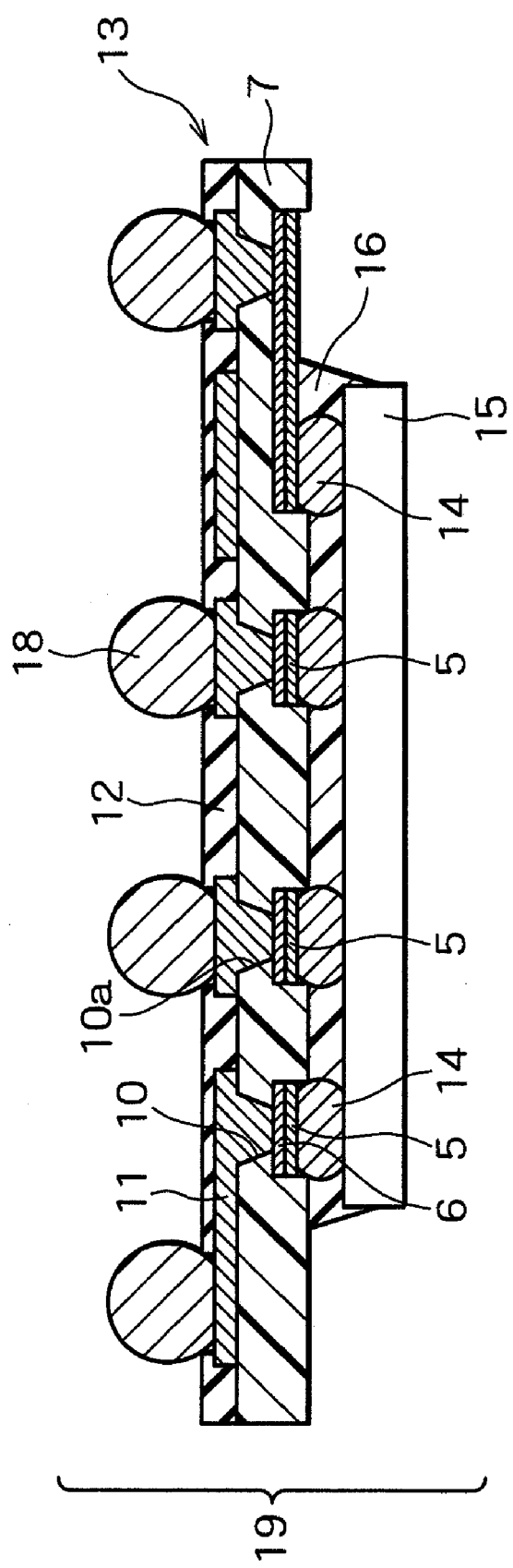
FIG. 5 is a cross-sectional view showing a semiconductor package according to the first embodiment.

In the following, embodiments of the present invention will be described specifically with reference to the accompanying drawings. First, a first embodiment of the invention will be described. FIG. 4 is a cross-sectional view showing a wiring board according to the embodiment, and FIG. 5 is a cross-sectional view showing a semiconductor package according to the embodiment.

As shown in FIG. 4, a wiring board 13 according to the embodiment is provided with a base insulating film 7. The base insulating film 7 is made of a heat-resistant resin having a glass-transition temperature of 150° C. or more and containing reinforcing fiber made of glass or aramid. The base insulating film 7 has a thickness of 20 to 100 μm and has the following physical properties (1) to (6) when the elastic modulus thereof at a temperature of T° C. is given as $D_T$(GPa) and the breaking strength thereof at a temperature of T° C. is given as $H_T$(MPa).

(1) A coefficient of thermal expansion in the direction of thickness thereof is 90 ppm/K or less.
(2) $D_{23} \geqq 5$
(3) $D_{150} \geqq 2.5$
(4) $(D_{-65}/D_{150}) \leqq 3.0$
(5) $H_{23} \geqq 140$
(6) $(H_{-65}/H_{150}) \leqq 2.3$ The heat-resistant resin having a glass-transition temperature of 150° C. or more is preferably epoxy resin in terms of impregnating ability to the reinforcing fiber, but polyimide resin, cyanate resin, liquid crystal polymer, or the like can be made applicable.

Concave portions 7a are formed in the under surface of the base insulating film 7, wiring bodies 6 are each formed in the concave portion 7a, and etching barrier layers 5 are each formed under the wiring body 6. The etching barrier layer 5 and the wiring body 6 form a lower wiring, and the lower wiring is embedded in the concave portion 7a. The under surface of the etching barrier layer 5 is exposed and forms a part of the under surface of the wiring board 13. The wiring body 6 is made of, for example, Cu, Ni, Au, Al or Pd, and has a film thickness of, for example, 2 to 20 μm. The etching barrier layer 5 is made of, for example, Ni, Au, or Pd, and has a thickness of, for example, 0.1 to 7.0 μm. The under surface of the etching barrier layer 5 is located higher than the under surface of the base insulating film 7 by, for example, 0.5 to 10 μm, i.e., the under surface of the etching barrier layer 5 is located deep in the concave portion 7a.

Also, via holes 10 are each formed in the base insulating film 7 so as to be located on a part of the upper side of the concave portion 7a. When the wiring board 13 is used for the semiconductor package of CSPs (chip-size packages), the diameter of the via hole 10 is, for example, 75 μm, and when the wiring board 13 is used for the semiconductor package of FCBGAs (flip-chip ball grid arrays), the diameter of the via hole 10 is, for example, 40 μm. Further, the via hole 10 is filled with a conductive material, and an upper wiring 11 is formed on the base insulating film 7. The conductive material in the via hole 10 and the upper wiring 11 are formed integrally. The upper wiring 11 has a thickness of, for example, 2 to 20 μm and is connected to the lower wiring via the via holes 10. Still further, a solder resist 12 is formed on the base insulating film 7 in a manner that a part of the upper wiring 11 is exposed and the remainder thereof is covered by the solder resist 12. The thickness of the solder resist 12 is, for example, 5 to 40 μm. The exposed portions of the upper wiring 11 act as pad electrodes.

Next, the configuration of a semiconductor package according to the embodiment will be described. In the semiconductor package 19 according to the embodiment, a plurality of bumps 14 are each connected to the etching barrier layer 5 of the wiring board 13 as shown in FIG. 5. A semiconductor device 15 is provided under the wiring board 13, and the electrodes of the semiconductor device 15 (not shown) are each connected to the bump 14. The semiconductor device 15 represents, for example, an LSI (large scale integrated circuit). The periphery of the bumps 14 between the wiring board 13 and the semiconductor device 15 is filled with an underfill layer 16. Solder balls 18 are each provided on the exposed portion of the upper wiring 11 of the wiring board 13, that is, a part of the pad electrode. The solder ball 18 is connected to the electrode of the semiconductor device 15 via the upper wiring 11, the via hole 10 (see FIG. 4), the lower wiring composed of the wiring body 6 and the etching barrier layer 5, and the bump 14. The semiconductor package 19 is mounted on a packaging board (not shown) via the solder balls 18.

The criticality of the numeric values of individual structural requirements of the invention will be described below.

Thickness of Base Insulating Film: 20 to 100 μm

When the thickness of the base insulating film is less than 20 μm, the heat-resistant resin cannot effectively contain the reinforcing fibers made of glass or aramid. On the contrary, the thickness of the base insulating film exceeds 100 μm, the workability of the via holes through laser processing is decreased significantly, which makes it impossible to form fine via holes. Therefore, the thickness of the base insulating film is set at 20 to 100 μm.

Coefficient of Thermal Expansion in Direction of Thickness of Base Insulating Film: 90 ppm/K or Less As to the base insulating film having a coefficient of thermal expansion in the direction of its thickness of more than 90 ppm/K, when the via holes are formed immediately under the electro pads on which the semiconductor device is mounted, and the solder balls used for board packaging are provided immediately under the via holes, open failure occurred at the junctions of the via holes 10a shown in FIG. 5 through a heat cycle test under the assumption that heat load is repeatedly applied by the operation of the semiconductor device. Therefore, the coefficient of thermal expansion in the direction of thickness of the base insulating film is 90 ppm/K or less.

Elastic Modulus of Base Insulating Film at a Temperature of 23° C.: 5 GPa or More When the elastic modulus of the base insulating film at a temperature of 23° C. is less than 5 GPa, the wiring board including the 20 μm thick base insulating film is poor in transferability during the semiconductor package assembly, which reduces the productivity thereof significantly. Therefore, the elastic modulus of the base insulating film at a temperature of 23° C. is set at 5 GPa or more.

Elastic Modulus of Base Insulating Film at a Temperature of 150° C.: 2.5 GPa or More In base insulating films made of a single material, when the elastic modulus of the base insulating films at a temperature of 150° C. is 1.0 GPa or more, good wire bonding characteristics can often be obtained. However, in the base insulating film made of the resin containing the glass or aramid reinforcing fibers, since the elastic modulus of the reinforcing fibers alone at a temperature of 150° C. is at a high level of 10 GPa or more, the elastic modulus of the resin alone at a temperature of 150° C. will become 0.1 GPa or less even though the elastic modulus of the base insulating film at a temperature of 150° C. is 1.0 GPa. Because of this, when wire bonding is carried out, the wiring body 6 is depressed, so that it is impossible to establish a wire connection which achieves a high strength. In view of this, as a result of verifying the relationship between the elastic modulus of the base insulating film at a temperature of 150° C. and the wire bonding strength by experiment, it has been found that it is possible to achieve favorable wire bonding characteristics when the elastic modulus at a temperature of 150° C. is 2.5 GPa or more. Therefore, the elastic modulus of the base insulating film at a temperature of 150° C. is set at 2.5 GPa or more. In addition, to meet the requirement that the elastic modulus at a temperature of 150° C. is 2.5 GPa or more, it has been found that the heat-resistant resin impregnated into the reinforcing fibers must have a glass-transition temperature of 150° C. or higher. The glass-transition temperature is in conformity with JIS (Japanese Industrial Standard) 6481 and is measured by DMA (dynamic mechanical analysis).

Where $D_T$ (GPa) is Elastic Modulus of Base Insulating Film at a Temperature of T° C., Value ($D_{-65}/D_{150}$): 3.0 or Less Being large in value ($D_{-65}/D_{150}$) means that a variation in the elastic modulus at low and high temperatures is great. In Japanese Patent Application No. 2003-382418, there is a description that when the value ($D_{-65}/D_{150}$) is large, the solder balls attached to the wiring board are broken, so that the value must be 4.7 or smaller. However, it has been found that when the value ($D_{-65}/D_{150}$) is larger than 3.0, strain stress is applied to the wiring board by heating and cooling repeatedly during the semiconductor package assembly to develop trouble that the semiconductor package itself suffers warping. Therefore, the value ($D_{-65}/D_{150}$) is 3.0 or smaller.

Breaking Strength of Base Insulating Film at a Temperature of 23° C.: 140 MPa or More In the wiring board having a 20 μm thickness base insulating film, when the breaking strength of the base insulating film at a temperature of 23° C. is lower than 140 MPa, the base insulating film is cracked during transfer in the step of assembling the semiconductor package. Therefore, the breaking strength of the base insulating film at a temperature of 23° C. is set at 140 MPa or higher.

Where $H_T$ (MPa) is Breaking Strength of Base Insulating Film at a Temperature of T° C., Value ($H_{-65}/H_{150}$): 2.3 or Less Being large in value ($H_{-65}/H_{150}$) means that a variation in the breaking strengths at low and high temperatures is great. In Japanese Patent Application No. 2003-382418, there is a description that when the value ($H_{-65}/H_{150}$) is large, the base insulating film becomes cracked, so that the value must be 4.5 or smaller. However, it has been found that when the value ($H_{-65}/H_{150}$) is larger than 2.3, the mechanical strength thereof decreases remarkably at high temperatures, so that the base insulating film becomes cracked slightly in the step of assembling the semiconductor package at high temperatures such as wire bonding. Therefore, the value ($H_{65}/H_{150}$) is 2.3 or smaller.

Distance Between Under Surface of Lower Wiring And Under Surface of Base Insulating Film: 0.5 to 10 μm When the distance between the under surface of the lower wiring and the under surface of the base insulating film is shorter than 0.5 μm, the effect of preventing the positional deviation of the bumps cannot be secured sufficiently. On the other hand, when the distance exceeds 10 μm, a gap between the base insulating film and the semiconductor device becomes narrow when the semiconductor device is mounted to the wiring board. Because of this, when the gap is filled with an underfilling resin to provide the underfill layer after the mounting of the semiconductor device, it becomes difficult to pour the underfilling resin into the gap. Therefore, the distance is preferably 0.5 to 10 μm.

In the semiconductor package 19 according to the embodiment, the semiconductor device 15 is driven by supplying a power and inputting and outputting signals from the mounting board (not shown) to the semiconductor device 15 via the solder balls 18, the upper wiring 11, the via holes 10, the lower wiring composed of the wiring body 6 and the etching barrier layer 5, and the bumps 14. At this time, the semiconductor device 15 generates heat, and the heat is conveyed to the mounting board via the wiring board 13. Here, a thermal stress is applied to the bumps 14, the wiring board 13, and the solder balls 18 by a difference in the coefficients of thermal expansion of the semiconductor device 15 and the mounting board. Therefore, through repeated operations and stops of the semiconductor device 15, the thermal stress is repeatedly applied to the bumps 14, the wiring board 13, and the solder balls 18.

According to the embodiment, since the base insulating film has a thickness of 20 to 100 μm, the elastic modulus of 5 GPa or more at a temperature of 23° C., the breaking strength of 140 MPa or more at a temperature of 23° C., the elastic modulus of 2.5 GPa or more at a temperature of 150° C., the value ($D_{-65}/D_{150}$) of 3.0 or less where $D_T$ is the elastic modulus at a temperature of T° C., and the value ($H_{-65}/H_{150}$) of 2.3 or less where $H_T$ is the breaking strength at a temperature of T° C., the transferability and wire bonding characteristics thereof are favorable in the step of assembling the semiconductor package 19, which makes it possible to fabricate the semiconductor package 19 which has no warpage and which is of excellent quality. In addition, since the coefficient of thermal expansion in the direction of thickness of the base insulating film is 90 ppm/K or less, open failure does not occur at the junctions of the via holes 10a shown in FIG. 5 even when the heat cycle test is conducted under the assumption that heat load is repeatedly applied by the operation of the semiconductor device.

Also, since the lower wiring composed of the etching barrier layer 5 and the wiring body 6 is present in the concave portion 7a, and the under surface of the lower wiring is located higher than that of the base insulating film 7 by 0.5 to 10 μm, it is possible to prevent the positional deviation and flow of the bumps 14 during the bonding of the bumps 14. Because of this, bumps 14 have an excellent bonding reliability and can be provided with a narrow pitch, which allows the high-density semiconductor device 15 to be mounted.

Further, since the wiring board 13 has no penetrating through hole, a problem caused by the penetrating through hole, that is, a problem that control of impedance becomes difficult and loop inductance increases, does not come up, which allows a high-speed transmission and a high-density fine wiring to be designed.

In this embodiment, the underfill layer 16 may be omitted. Also, since flip chip-type semiconductor packages generally require no molding, the semiconductor package according to the embodiment is also not provided with the molding. However, when the semiconductor package is required to have a higher degree of moisture resistance reliability, when it is desired that the sealing properties (hermeticity) of the semiconductor device be enhanced, and when it is desired that the mechanical strength of the semiconductor package be increased in spite of the thinness of the wiring board, the molding may be provided to the under surface of the wiring board 13 so as to cover the underfill layer 16 and the semiconductor device 15.

Still further, in the first embodiment, the semiconductor device 15 mounted on the bumps 14 by flip chip bonding has been exemplified, while there is no limitation on the mounting method of the semiconductor device 15, so that wire bonding, tape automated bonding, and so on are also applicable.

Figure 6:
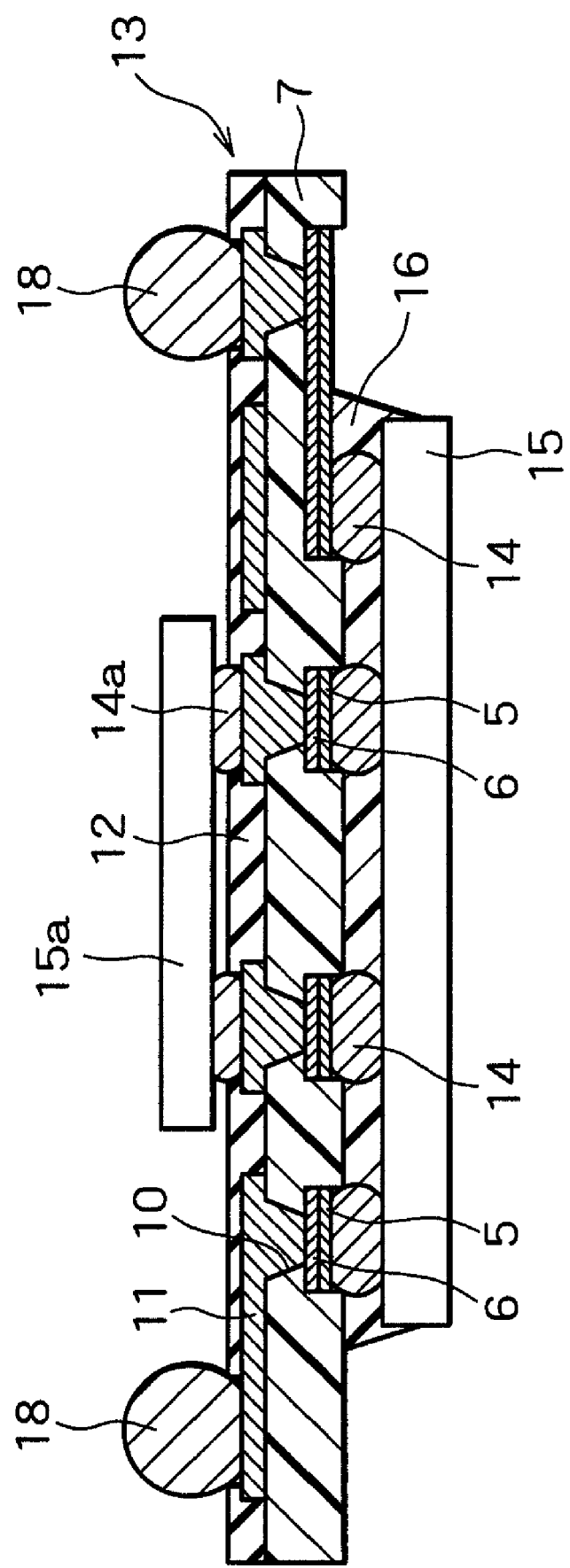
FIG. 6 is a cross-sectional view showing a semiconductor package according to a modification of the first embodiment.

Next, a modification according to the embodiment will be described. FIG. 6 is a cross-sectional view showing a semiconductor package according to the modification. In the semiconductor package according to the modification, semiconductor devices are each mounted to both sides of the wiring board 13 as shown in FIG. 6. That is, besides the semiconductor device 15 connected to the lower wiring via the bumps 14, the semiconductor device 15a is provided so as to be connected to the upper wiring 11 via bumps 14a. Some of the electrodes of the semiconductor device 15 are connected to the electrodes of the semiconductor device 15a (not shown) via the bumps 14, the lower wiring composed of the etching barrier layer 5 and the wiring body 6, the via holes 10, the upper wiring 11, and the bumps 14a. The structure of the modification other than that described above is the same as that of the first embodiment. Therefore, according to the modification, it is possible to mount the two semiconductor devices to the single wiring board 13.

Figure 7:
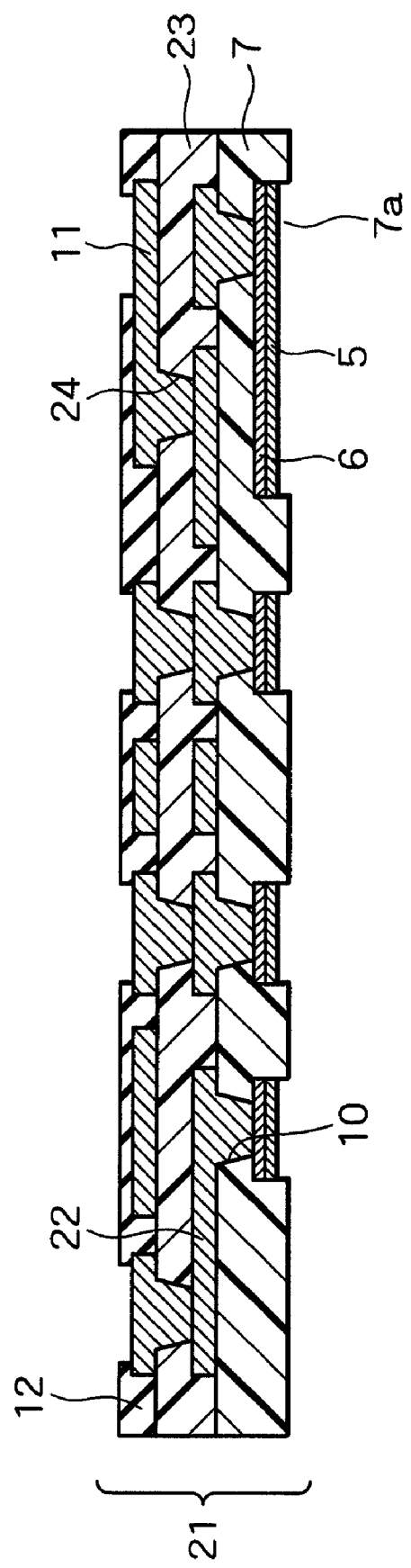
FIG. 7 is a cross-sectional view showing a wiring board according to a second embodiment of the invention.
Figure 8:
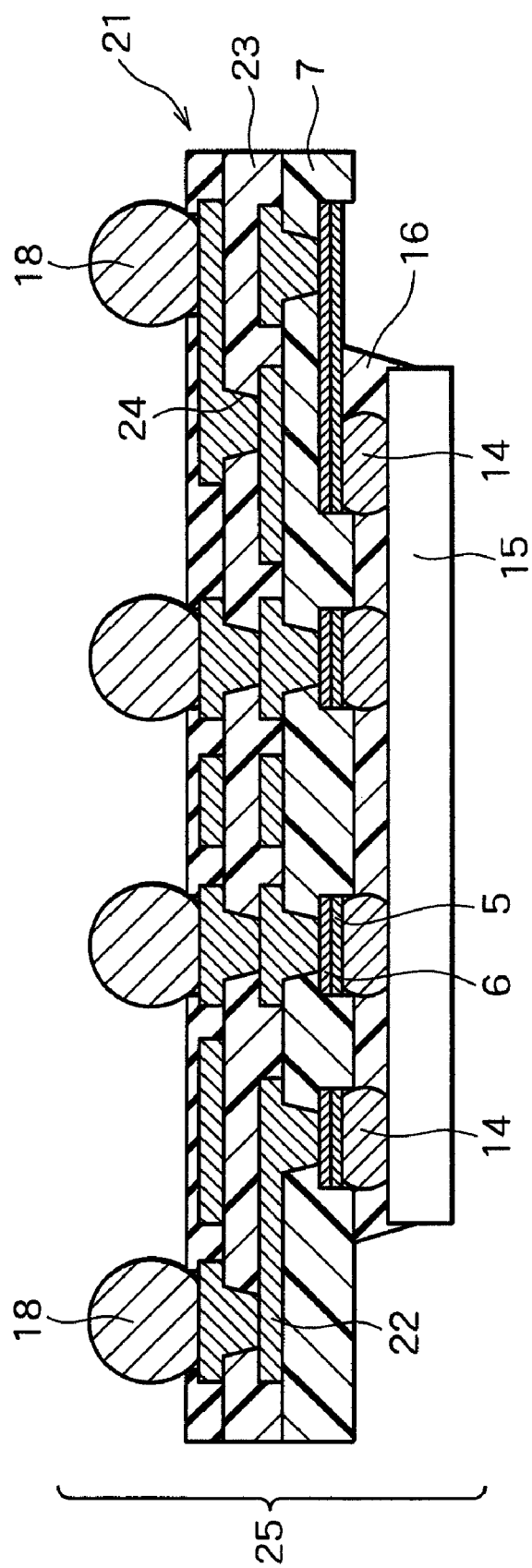
FIG. 8 is a cross-sectional view showing a semiconductor package according to the second embodiment.

Next, a second embodiment according to the invention will be described. FIG. 7 is a cross-sectional view showing a wiring board according to the embodiment, and FIG. 8 is a cross-sectional view showing a semiconductor package according to the embodiment.

As shown in FIG. 7, a wiring board 21 according to the embodiment is provided with the base insulating film 7. The thickness and mechanical properties of the base insulating film 7 are the same as those of the base insulating film 7 of the first embodiment. The concave portions 7a are formed in the under surface of the base insulating film 7, the wiring body 6 is formed in the concave portion 7a, and the etching barrier layer 5 is formed under the wiring body 6. The lower wiring is composed of the etching barrier layer 5 and the wiring body 6, and the lower wiring is embedded in the concave portion 7a. The configuration of the etching barrier layer 5 and the wiring body 6 is the same as that of the first embodiment.

The via holes 10 are formed in the base insulating film 7 so as to be located on a part of the upper side of the concave portion 7a. The via hole 10 is filled with the conductive material, and an intermediate wiring 22 is formed on the base insulating film 7. The conductive material in the via holes 10 and the intermediate wiring 22 are formed integrally, the intermediate wiring 22 is connected to the lower wiring via the via holes 10. Furthermore, an intermediate insulating film 23 is formed on the base insulating film 7 so as to cover the intermediate wiring 22, and via holes 24 are formed in the intermediate insulating film 23 so as to be located on a part of the upper side of the intermediate wiring 22. The via holes 24 are filled with the conductive material, and the upper wiring 11 is formed on the intermediate insulating film 23. The conductive material on the via holes 24 and the upper wiring 11 are formed integrally, and the upper wiring 11 is connected to the intermediate wiring 22 via the via holes 24. Furthermore, a solder resist 12 is formed on the intermediate insulating film 23 so as to expose some of the upper wiring 11 and cover the remaining portions of the upper wiring 11. The exposed portions of the upper wiring 11 act as pad electrodes. The thickness and mechanical properties of the intermediate insulating film 23 are preferably the same as those of the base insulating film 7 but may be different from those of the base insulating film 7 as required.

In addition, in the wiring board according to the second embodiment, the insulating layers are provided in two layers, but the invention is not limited to such a structure; the wiring board may have structures wherein the insulating films are provided in three layers or more.

Next, the structure of a semiconductor package according to the embodiment will be described. In the semiconductor package 25 according to the embodiment, the plurality of bumps 14 are connected to the etching barrier layer 5 of the wiring board 21 as shown in FIG. 8. The semiconductor device 15 is provided under the wiring board 21, and the electrodes of the semiconductor device 15 (not shown) are connected to the bumps 14. The periphery of the bumps 14 between the wiring board 21 and the semiconductor device 15 is filled with the underfill layer 16. The solder balls 18 are provided on the exposed portions of the upper wiring 11 of the wiring board 21, i.e., some of the pad electrodes. The solder balls 18 are connected to the electrodes of the semiconductor device 15 via the upper wiring 11, the via holes 24, the intermediate wiring 22, the via holes 10, the lower wiring composed of the wiring body 6 and the etching barrier layer 5, and the bumps 14. The structure and operation of the wiring board and semiconductor package according to the embodiment other than those described above are the same as those of the first embodiment.

In this embodiment, the wiring board 21 takes the form of a two-layer structure including the base insulating film 7 and the intermediate insulating film 23, that is, the wiring board 21 is provided with the intermediate wiring 22 unlike the wiring board according to the first embodiment, so that it is possible to increase the number of signals which input to and output from the semiconductor device 15. The effects achieved in the embodiment other than that described above are the same as those achieved in the first embodiment.

Figure 9A:
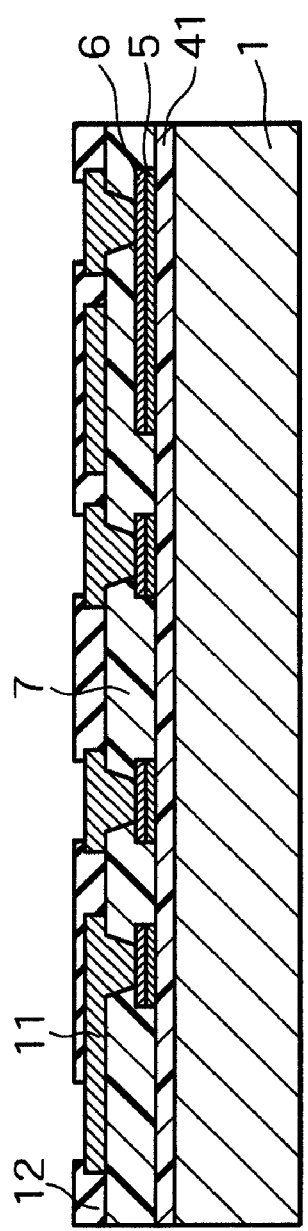
FIG. 9A to FIG. 9C are cross-sectional views showing a manufacturing method and a configuration of a wiring board according to a third embodiment of the invention in the order of its manufacturing steps.
Figure 9B:
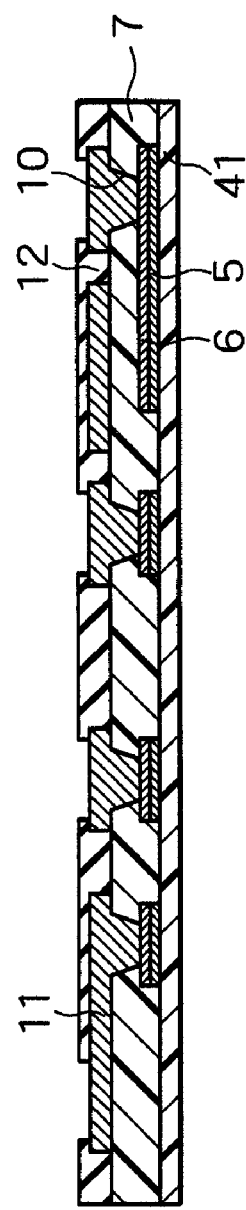
Figure 9C:
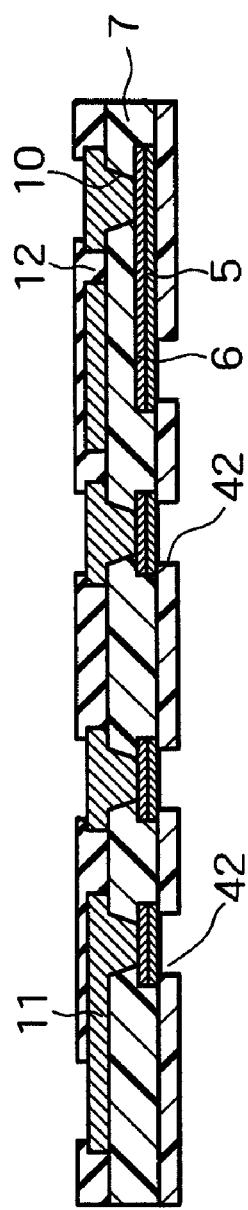

Next, a third embodiment according to the invention will be described. FIG. 9A to FIG. 9C are cross-sectional views showing the configuration of a wiring board according to the embodiment in the order of its manufacturing steps. In the wiring board according to the embodiment, the under surface of the base insulating film 7 and the under surface of the lower wiring composed of the etching barrier layer 5 and the wiring body 6 are made coplanar. A protective film 41 is formed under the base insulating film 7. The protective film 41 is made of, for example, epoxy resin or polyimide resin and has a thickness of, for example, 1 to 50 μm. The protective film 41 has etched portions 42 as openings, and some portions of the lower wiring are exposed at the etched portions 42. That is, the protective film 41 is formed in a manner that some portions of the lower wiring are exposed at the etched portions 42, and the remainder of the lower wiring is covered with the portions of the protective film 41 other than the etched portions 42. The etched portions 42 are portions to which the bumps 14 (see FIG. 4) are connected when the semiconductor device is mounted to the wiring board. The configurations and operations of the wiring board and the semiconductor package according to the embodiment other than those described above are the same as those of the first embodiment.

In this embodiment, the adhesion of the wiring board and the resin layer such as the underfill layer can be enhanced by providing the protective film 41. The effects achieved in the embodiment other than that described above are the same as those achieved in the first embodiment.

Next, a fourth embodiment of the invention will be described. FIG. 10 is a cross-sectional view showing a wiring board according to the embodiment. As shown in FIG. 10, the wiring board according to the embodiment has no protective film 41 (see FIG. 9) unlike the wiring board according to the third embodiment. Therefore, the under surface of the lower wiring is not depressed from the under surface of a wiring board 43, that is, the under surface of the lower wiring and the under surface of the wiring board 43 are made coplanar. The configuration of the wiring board according to the embodiment other than that described above is the same as that described in the third embodiment.

Since the wiring board according to the embodiment does not include the protective film unlike the wiring board according to the third embodiment, the production cost thereof can be reduced. In addition, the formation of an easy-to-etch layer 4 (see FIG. 11A) can be omitted unlike that described in the first embodiment, which makes it possible to reduce the production cost thereof. From the point of view of the production cost thereof, the wiring board according to the embodiment is suitable in the following cases: a case where the pitch of the electrodes provided in the semiconductor device 15 is not very narrow; a case where the positional accuracy of the bumps is not really required because the density of the bumps 14 provided (see FIG. 4) is low; and a case where the adherence of the molding and the wiring board is not really required regardless of the presence or absence of the molding. The effects of the embodiment other than that described above are the same as those of the first embodiment.

Figure 11A:
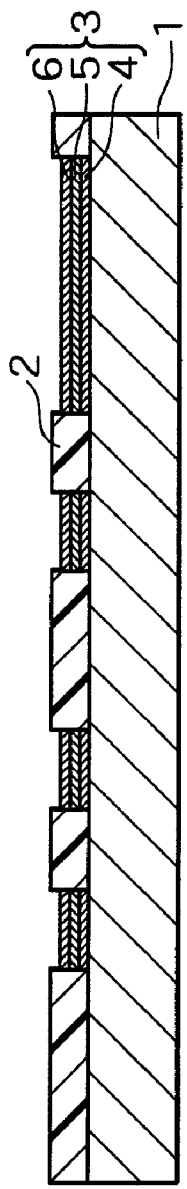
FIG. 11A to FIG. 11E are cross-sectional views showing a manufacturing method of the wiring board according to the first embodiment of the invention in the order of its manufacturing steps.

Next, methods for manufacturing the wiring boards and the semiconductor packages according to the respective embodiments are described. First, the method for manufacturing the wiring board and the semiconductor package according to the first embodiment will be described. FIG. 11A to FIG. 11E are cross-sectional views showing the wiring board according to the embodiment in the order of its manufacturing steps. FIG. 12A and FIG. 12B are cross-sectional views showing the semiconductor package according to the embodiment in the order of its manufacturing steps. FIG. 12C is a cross-sectional view of the semiconductor package provided with the molding. As shown in FIG. 11A, a supporting substrate 1 made of a metal or an alloy such as Cu is prepared, a resist 2 is formed on the supporting substrate 1 for patterning. Then the easy-to-etch layer 4, the etching barrier layer 5, and the wiring body 6 are formed in that order by, for example, plating. At this time, a conductor wiring layer 3 composed of the easy-to etch layer 4, the etching barrier layer 5, and the wiring body 6 is formed at regions on the supporting substrate 1 where the resist 2 is removed, while the conductor wiring layer 3 is not formed at regions where the resist 2 is left. The easy-to-etch layer 4 is a plated layer composed of a singe Cu layer, a doubly plated layer composed of Cu and Ni layers, or a plated layer composed of a single Ni layer, for instance, and is 0.5 to 10 μm in thickness, for instance. The Ni layer of the doubly plated layer is provided to prevent diffusion between the Cu layer of the easy-to-etch layer 4 and the etching barrier layer 5 under high temperature conditions and is 0.1 μm or more in thickness, for instance. The etching barrier layer 5 is a plated Ni layer, a plated Au layer, or a plated Pd layer, for instance, and is 0.1 to 7.0 μm in thickness, for instance. The wiring body 6 is formed using a plated conductor layer of, for instance, Cu, Ni, Au, Al, or Pd and is 2 to 20 μm in thickness, for instance. Also, when the etching barrier layer 5 is formed using Au, a Ni layer may be provided between the etching barrier layer 5 and the wiring body 6 to prevent diffusion between the etching barrier layer 5 and the Cu forming the wiring body 6.

Figure 11B:
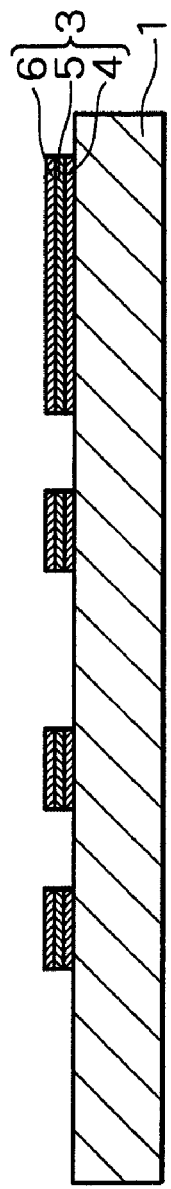
Figure 11C:
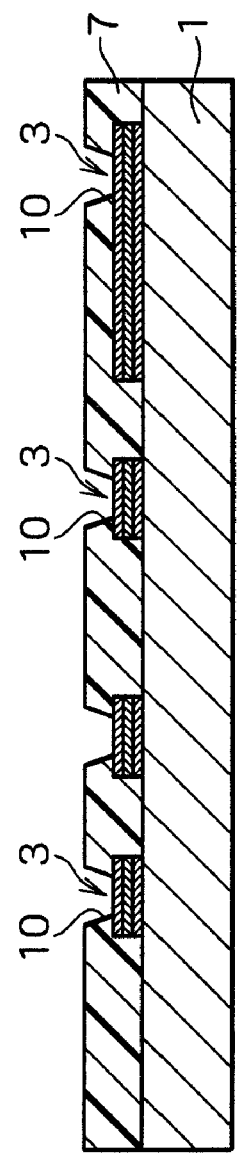
Figure 12A:
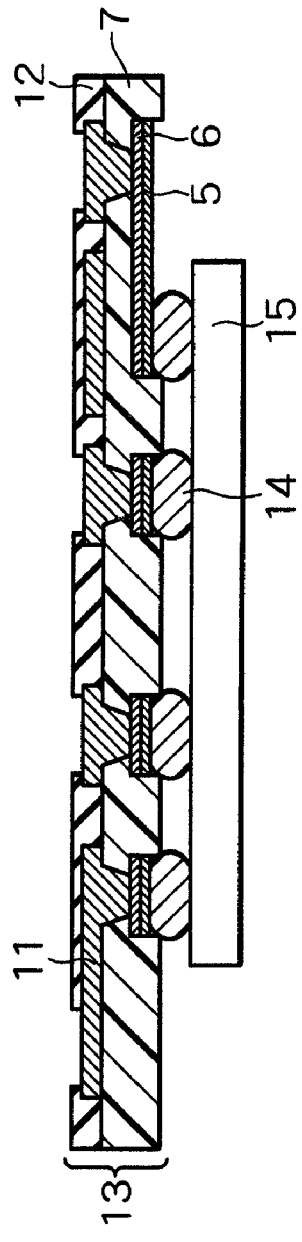
FIG. 12A to FIG. 12C are cross-sectional views showing a manufacturing method of a semiconductor package according to the first embodiment in the order of its manufacturing steps.
Figure 12B:
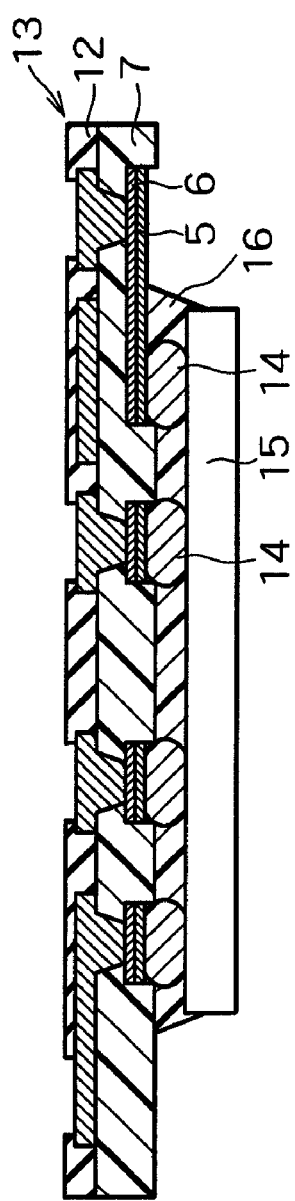
Figure 12C:
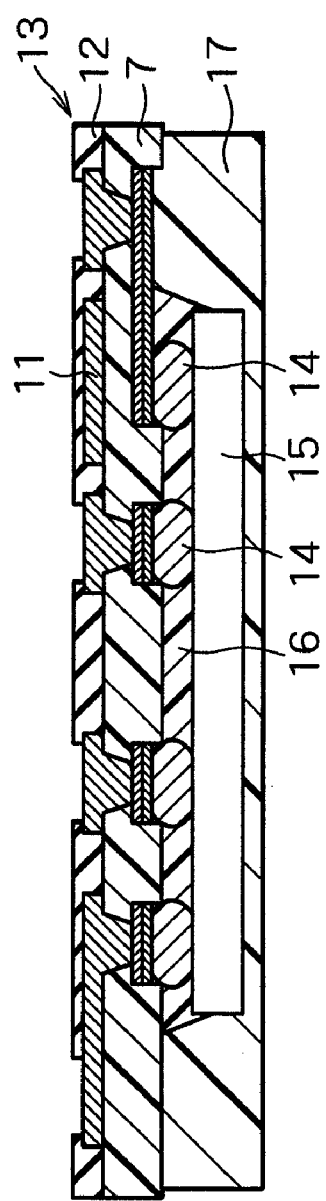

As shown in FIG. 11B, the resist 2 is removed. Then, as shown in FIG. 11C, the base insulating film 7 is formed so as to cover the conductor wiring layer 3. The method for forming the base insulating film 7 is, for instance, as follows: a sheet-shaped insulating film and the supporting substrate 1 are laminated together, or the sheet-shaped insulating film is applied to the supporting substrate 1 by pressing to form a film; then the film is heat treated in a manner that the film is held for 10 minutes to 2 hours at a temperature of 100 to 400° C., for instance; and the film is finally cured. The temperature and the time of the heat treatment are adjusted according to the kind of insulating film. In addition, the via holes 10 are formed in the base insulating film 7 through laser processing so as to be located on portions of the upper side of the conductor wiring layer 3.

Figure 11D:
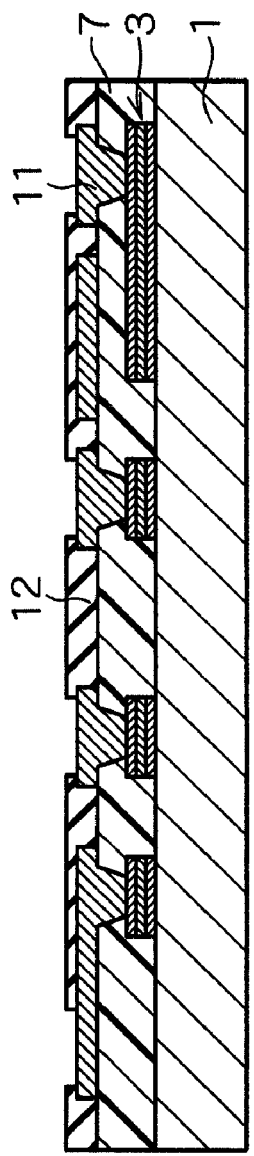

As shown in FIG. 11D, the via holes 10 are filled with the conductive material, and the upper layer 11 is formed on the base insulating film 7. At this time, the upper layer 11 is connected to the wiring body 6 via the via holes 10. When the wiring board 13 is used for the semiconductor package of CSPs (chip-size packages), the diameter of the via hole 10 is, for instance, 75 μm, and when the wiring board 13 is used for the semiconductor package of FCBGAs (flip-chip ball grid arrays), the diameter of the via hole 10 is, for instance, 40 μm. The conductive material embedded in the via hole 10 and the upper wiring 11 are made of a plated conductor layer such as Cu, Ni, Au, Al, or Pd, and the thickness of the upper wiring 11 is 2 to 20 μm, for instance. Then the solder resist 12 is formed so as to cover a part of the upper wiring 11 and expose the remainder of the upper wiring 11. The thickness of the solder resist 12 is 5 to 40 μm, for instance. However, the formation of the solder resist 12 can be omitted.

Figure 11E:

As shown in FIG. 11E, the supporting substrate 1 is removed by chemical etching or polishing. Next, as shown in FIG. 4, the easy-to-etch layer 4 is removed by etching. As a result, the wiring board 13 according to the embodiment illustrated in FIG. 4 is formed. At this time, when the material used for the supporting substrate 1 is different from that used for the easy-to-etch layer 4, etching must be performed twice as described previously, but when the material used for the supporting substrate 1 is the same as that used for the easy-to-etch layer 4, etching may be performed only once.

As shown in FIG. 12A, the plurality of bumps 14 are each bonded to the exposed portions of the etching barrier layer 5. Then the semiconductor device 15 is mounted to the wiring board 13 via the bumps 14 by means of flip chip bonding such that the electrodes of the semiconductor device 15 (not shown) are connected to the bumps 14.

As shown in FIG. 12B, the underfill layer 16 is poured between the wiring board 13 and the semiconductor device 15 and is solidified. As a result, the bumps 14 are embedded in the underfill layer 16. The formation of the underfill layer 16, however, may be omitted. In addition, as shown in FIG. 12C, a molding 17 may be formed suitably on the lower surface of the wiring board 13 so as to cover the underfill layer 16 and the semiconductor device 15.

Next, the solder balls 18 are provided on the exposed portions of the upper layer 11 of the wiring board 13 as shown in FIG. 5. As a result, the semiconductor package 19 according to the first embodiment shown in FIG. 5 is formed.

In the first embodiment, for instance, it is possible to enhance the flatness of the wiring board 13 to form the conductor wiring layer 3, the base insulating film 7, the upper wiring 11, and so forth on the hard supporting substrate 1 made of Cu.

In the first embodiment, the use of the substrate made of a metal or an alloy has been exemplified as the supporting substrate 1, while a substrate made of an insulator such as silicon wafer, glass, ceramic, or resin may be used as the supporting substrate 1. When a substrate made of an insulator is used, the conductor wiring layer 3 can be formed by electroless plating after the formation of the resist 2, or a powering conductor layer can be formed through a method such as electroless plating, sputtering or vapor deposition after the formation of the resist 2, and then the conductor wiring layer 3 can be formed by electroplating.

Also, in the embodiment, one example in which the semiconductor device 15 is mounted to the wiring board 13 through a flip chip method has been described, while the semiconductor device 15 may be mounted to the wiring board 13 through other methods such as wire bonding, and tape automated bonding.

Next, a method for manufacturing the wiring board and the semiconductor package according to the second embodiment is described. FIG. 13A to 13D are cross-sectional views of the wiring board according to the embodiment illustrated in the order of its manufacturing steps. To begin with, the conductor wiring layer 3 composed of the easy-to-etch layer 4, the etching barrier layer 5, and the wiring body 6 is formed on the supporting substrate 1, the base insulating layer 7 is formed so as to cover the conductor wiring 3, and the via holes 10 are formed in the base insulating film 7 through the methods illustrated in FIG. 11A to FIG. 11C.

Figure 13A:
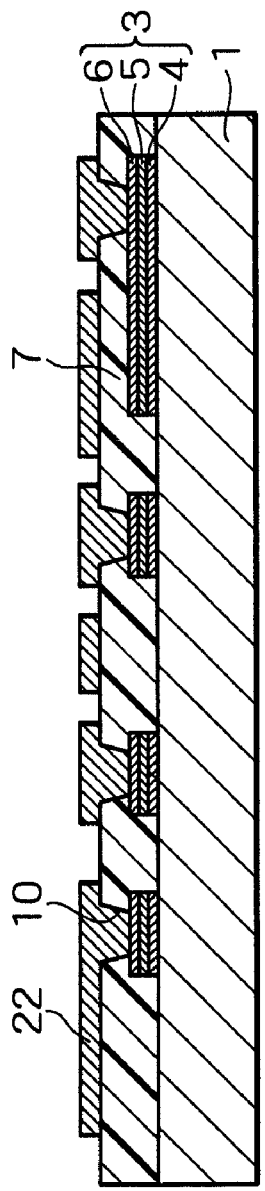
FIG. 13A to FIG. 13D are cross-sectional views showing a manufacturing method of the wiring board and the semiconductor package according to the second embodiment of the invention in the order of its manufacturing steps.
Figure 13B:
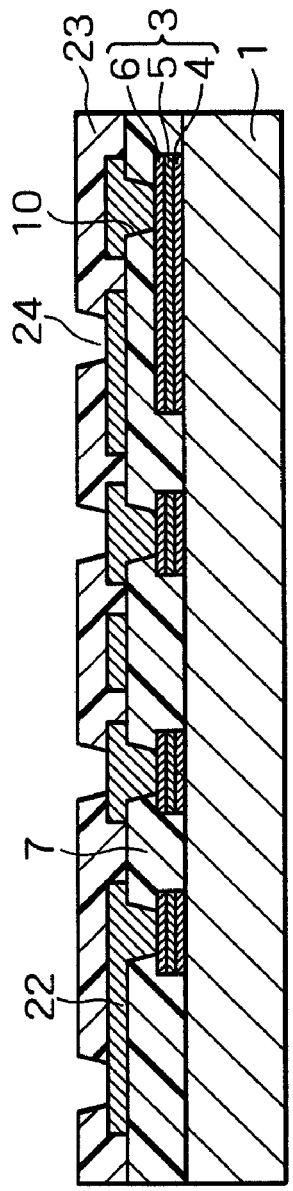

Next, as shown in FIG. 13A, the via holes 10 are filled with the conductive material, and the intermediate wiring 22 is formed on the base insulating film 7. At this time, the intermediate wiring 22 is connected to the wiring body 6 via the via holes 10. Thereafter, as shown in FIG. 13B, the intermediate insulating film 23 is formed so as to cover the intermediate wiring 22. The method for forming the intermediate insulating film 23 is, for instance, the same as that for forming the base insulating film 7. Then, the via holes 24 are formed in the intermediate insulating film 23 so as to be located on the portions of the upper side of the intermediate wiring 22.

Figure 13C:
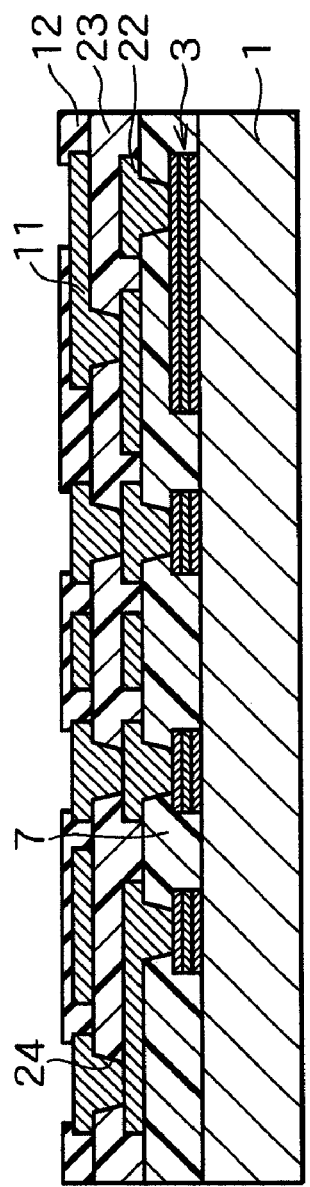
Figure 13D:
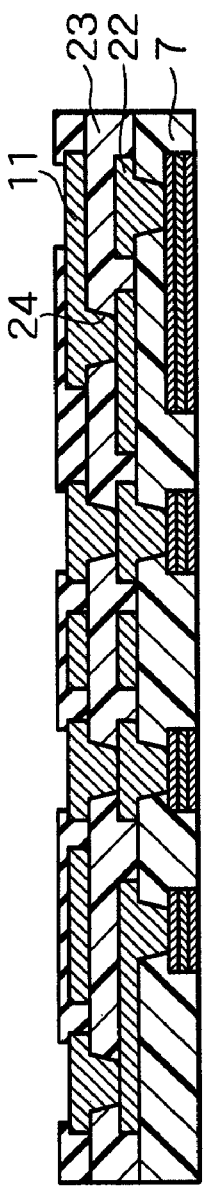

Next, as shown in FIG. 13C, the via holes 24 are filled with the conductive material, and the upper wiring 11 is formed on the intermediate insulating film 23. At this time, the upper wiring 11 is formed so as to be connected to the intermediate wiring 22 via the via holes 24. Then, the solder resist 12 is formed so as to cover a part of the upper wiring 11 and expose the remainder of the upper wiring 11. Thereafter, as shown in FIG. 13D, the supporting substrate 1 is removed by chemical etching or polishing.

Next, as shown in FIG. 7, the easy-to-etch layer 4 is removed by etching. As a result, the wiring board 21 according to the embodiment illustrated in FIG. 7 is formed.

In addition, as shown in FIG. 8, the plurality of bumps 14 are bonded to the exposed portion of the etching barrier layer 5. The semiconductor device 15 is mounted to the wiring board 21 via the bumps 14 through a flip chip method such that the electrodes of the semiconductor device 15 (not shown) are connected to the bumps 14. Then the underfill layer 16 is poured between the wiring board 21 and the semiconductor device 15 and then solidified, through which the bumps 14 are embedded in the underfill layer 16. Then the solder balls 18 are bonded to the exposed portion of the upper wiring 11 of the wiring board 21. As a result, the semiconductor package 25 according to the embodiment illustrated in FIG. 11 is formed. As in the cases of the first and second embodiments, the formation of the underfill layer 16 may be omitted. Alternatively, the molding may be formed on the under surface of the wiring board 21 so as to cover the underfill layer 16 and the semiconductor device 15.

Next, a method for manufacturing the wiring board according to the third embodiment will be described. To begin with, as shown in FIG. 9A, the protective film 41 is applied to the entire upper surface of the supporting substrate 1 by, for instance, laminating or pressing to form a film. Then, for instance, the film is heat treated in a manner that the film is held for 10 minutes to 2 hours at a temperature of 100 to 400° C. to harden the protective film 41. The temperature and the time of the heat treatment are suitably adjusted according to the materials of which the protective film 41 is made. The thickness of the protective film 41 is, for instance, 1 to 50 µm.

Next, a resist (not shown) is formed on the protective film 41 to perform patterning. The lower layer composed of the etching barrier layer 5 and the wiring body 6 is formed in the region where the resist has been removed. Furthermore, the base insulating film 7 is formed so as to cover the lower wiring, the via holes 10 are formed in the base insulating film 7, the via holes 10 are filled with the conductive material, and at the same time, the upper wiring 11 is formed on the base insulating film 7. Thereafter, the solder resist 12 is formed so as to cover a part of the upper wiring 11.

Next, as shown in FIG. 9B, the supporting substrate 1 is removed. Then, as shown in FIG. 9C, the protective film 41 is selectively removed by etching, and the lower wiring is exposed at the etched portion 42 where the protective film 41 has been removed, by which the wiring board according to the embodiment is formed. Furthermore, the bumps 14 (see FIG. 4) are attached to the etched portion 42, the semiconductor device 15 (see FIG. 4) is mounted, and the underfill layer 16 (see FIG. 4) is poured between the wiring board and the semiconductor device 15. Thereafter, the solder balls 18 (see FIG. 4) are connected to the upper wiring 11. As a result, the semiconductor package according to the embodiment is formed. The method for manufacturing the wiring board and the semiconductor package according to the embodiment other than that described above is the same as that of the first embodiment.

In the individual embodiments, the examples in which the supporting substrate 1 is finally removed are illustrated; however, the invention is not limited to such a structure. For instance, by removing only a part of the supporting substrate 1, the remainder of the supporting substrate 1 may be left, and the remainder may be used as, for instance, a stiffener. In addition, after the supporting substrate 1 has been completely removed once, a stiffener may be attached to the wiring board.

As described above, the wiring boards, the manufacturing methods therefore, the base insulating films, and the semiconductor packages according to the individual embodiments of the invention have been described with reference to the drawings; however, the specific configurations of the invention are not limited to the first to fourth embodiments described above, and it is possible to make design variations without departing from the spirit and scope of the invention.

Figure 14:
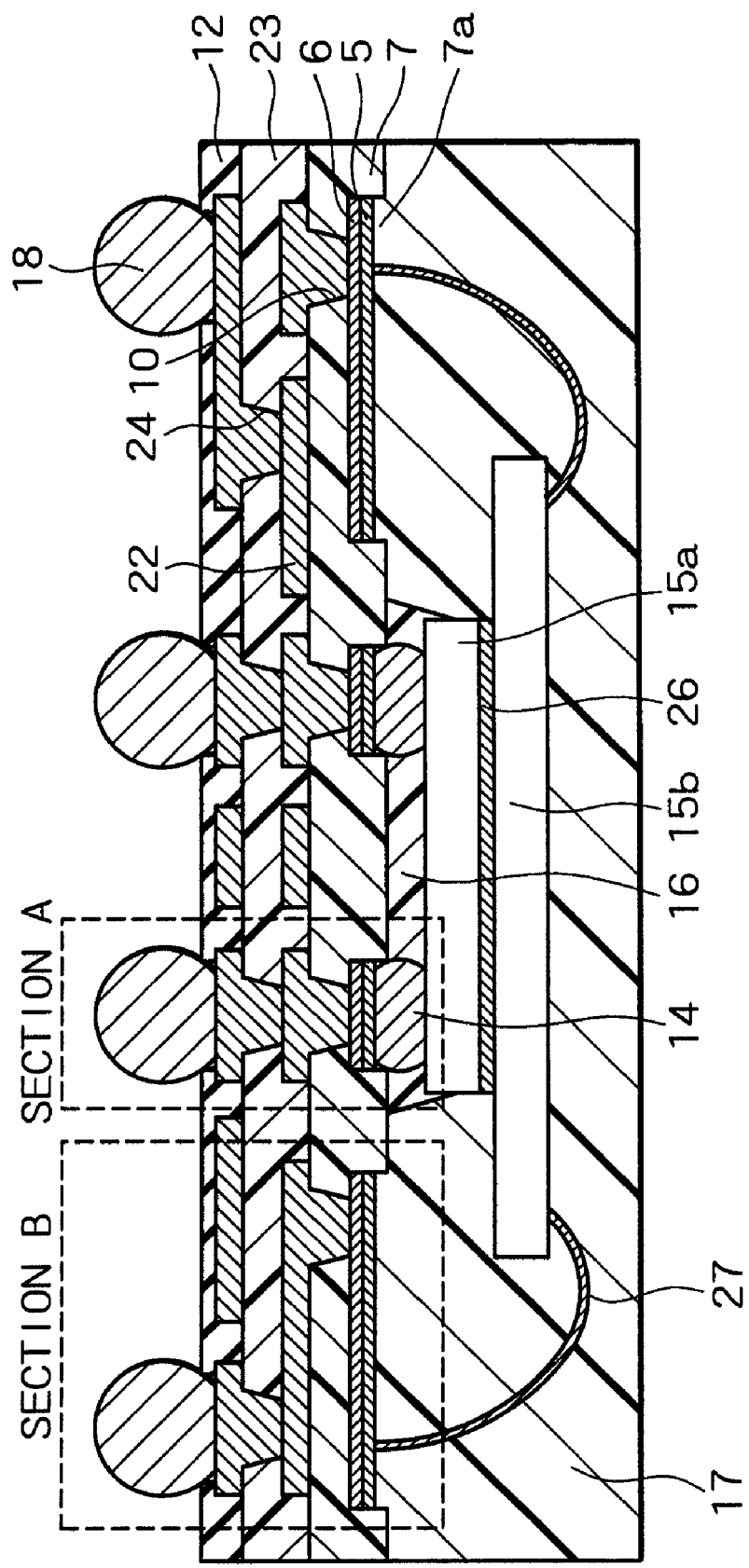
FIG. 14 is a cross-sectional view showing a semiconductor package used for an evaluation test.

In the following, the effects of the invention will be specifically described in comparison with comparative examples which are not within the claims of the invention. FIG. 14 is a cross-sectional view for showing the structure of a semiconductor package used for an evaluation test.

As shown in FIG. 14, a wiring board 21 having two insulating films was fabricated through the method shown in the second embodiment. Then a semiconductor device 15a was mounted to the wiring board 21 through the flip chip method to form an underfill layer 16. A semiconductor device 15b was provided on the semiconductor device 15a via a mounting material 26 and was electrically connected to the wiring board 21 by forming wires 27 through wire bonding. Thereafter, a molding 17 was formed so as to cover the semiconductor devices 15a and 15b, and solder balls 18 were provided to fabricate the semiconductor package used for the evaluation test. The data on the semiconductor package is indicated in Table 1.

TABLE 1

| | |
|---|---|
| Size of Semiconductor Device 15a | Length: 6 mm, Width: 6 mm |
| Size of Semiconductor Device 15b | Length: 10 mm, Width: 10 mm |
| Size of Package | Length: 12 mm, Width: 12 mm |
| Number of BGA Ball | 384 |
| Pitch of BGA Ball | 0.5 mm |
| Layer Number of Insulating Film | 2 |

As shown in Section A of FIG. 14, the semiconductor package used for the evaluation test has portions where bumps 14 on which the semiconductor device 15a is mounted, via holes 10 and 24, and the solder balls 18 are all aligned vertically. Furthermore, as shown in Section B, the semiconductor package also has portions where the bump 14, via holes 10 and 24, and the solder ball 18 are not aligned vertically.

Next, the mechanical properties, that is, the breaking strength, the elastic modulus, and the percentage of breaking elongation, of the insulating film of the test sample shown in Table 1 were measured. The measurement was carried out by cutting the insulating film into strips having a width of 1 centimeter and by conducting tensile testing in conformity with the "JPCA Standards, Built-Up Wiring Board, JPCA-BU01, SECTION 4.2." Temperatures for the measurement were set at three levels of −65° C., 23° C., and 150° C. The results of the measurement are indicated in Table 2.

TABLE 2

| | No. | Reinforcing Fiber | Breaking Strength MPa | Elastic Modulus at −65° C. GPa | Percentage of Breaking Elongation % | Breaking Strength MPa | Elastic Modulus at 23° C. GPa | Percentage of Breaking Elongation % | Breaking Strength MPa | Elastic Modulus at 150° C. GPa | Percentage of Breaking Elongation % | Coefficient of Thermal Expansion in Direction of Thickness ppm/K |
|---|---|---|---|---|---|---|---|---|---|---|---|---|
| Example | 1 | Glass | 240 | 11.8 | 1.3 | 185 | 10.5 | 1.6 | 160 | 8.4 | 1.6 | 72 |
| Example | 2 | Aramid | 207 | 9.4 | 3.3 | 182 | 6.4 | 3.9 | 122 | 3.9 | 4.0 | 90 |
| Example | 3 | Aramid | 188 | 9.0 | 3.0 | 170 | 5.7 | 3.8 | 94 | 3.6 | 3.9 | 87 |
| Example | 4 | Aramid | 181 | 8.4 | 2.8 | 155 | 5.3 | 3.6 | 86 | 3.0 | 3.7 | 80 |
| Example | 5 | Aramid | 179 | 7.5 | 2.8 | 140 | 5.0 | 3.3 | 78 | 2.5 | 3.6 | 76 |
| Comparative example | 6 | Glass | 282 | 12.2 | 1.8 | 260 | 11.5 | 2.1 | 188 | 8.7 | 2.1 | 96 |
| Comparative example | 7 | Aramid | 276 | 10.4 | 3.6 | 255 | 8.7 | 4.3 | 180 | 4.8 | 4.3 | 102 |
| Comparative example | 8 | Aramid | 228 | 9.7 | 3.4 | 218 | 8.0 | 4.0 | 140 | 4.4 | 4.1 | 95 |
| Comparative example | 9 | Aramid | 165 | 6.4 | 2.7 | 132 | 4.2 | 3.1 | 66 | 2.0 | 3.5 | 71 |

Figure 3A:
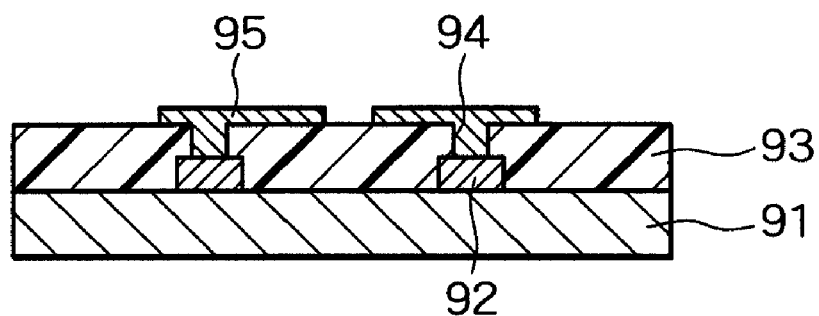
FIG. 3A and FIG. 3B are cross-sectional views showing another conventional manufacturing method of a wiring board in the order of its manufacturing steps.
Figure 3B:
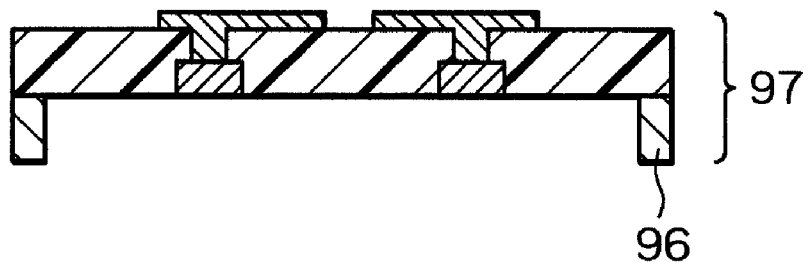

Also, the temperature dependency of the test samples was calculated based on the values of the mechanical properties shown in Table 2. That is, the values of the ratio ($D_{-65}/D_{150}$) and the values of the ratio ($H_{-65}/H_{150}$) where $D_T$ (GPa) is an elastic modulus at a temperature of T° C., and $H_T$ (MPa) is breaking strength at a temperature of T° C. were calculated. The results of the calculations are indicated in FIG. 3.

1999) on the accelerating property of temperature cycle testing, the heat cycle at the temperatures of −40° C. to 125° C., for instance, has an accelerating property which is 5.7 times higher than those under the actual-use conditions (25° C. to 70° C. and 1 cycle/day). Because of this, 600 cycles at the temperatures of (−40° C. to 125° C.) equate to about 10 years under the actual-use conditions.

TABLE 3

| | | Temperature Dependence Of Mechanical Properties | | Thermal Stress Durability (Number Of Failure Development Cycles) | | | | | |
|---|---|---|---|---|---|---|---|---|---|
| | | | | Single Semiconductor Package | | | Mounted On Board for Packaging | | |
| | No. | $H_{-65}/H_{150}$ | $D_{-65}/D_{150}$ | Open at Via, Section A | Open at Via, Section B | Open at Wire | Open at Via, Section A | Open at Via, Section B | Open at Wire |
| Example | 1 | 1.5 | 1.4 | more than 1500 | more than 1500 | more than 1500 | more than 1000 | more than 1000 | more than 1000 |
| Example | 2 | 1.8 | 2.4 | more than 1500 | more than 1500 | more than 1500 | more than 1000 | more than 1000 | more than 1000 |
| Example | 3 | 2.0 | 2.5 | more than 1500 | more than 1500 | more than 1500 | more than 1000 | more than 1000 | more than 1000 |
| Example | 4 | 2.1 | 2.8 | more than 1500 | more than 1500 | more than 1500 | more than 1000 | more than 1000 | more than 1000 |
| Example | 5 | 2.3 | 3.0 | more than 1500 | more than 1500 | more than 1500 | more than 1000 | more than 1000 | more than 1000 |
| Comparative example | 6 | 1.5 | 1.4 | 1100 | more than 1500 | more than 1500 | 750 | more than 1000 | more than 1000 |
| Comparative example | 7 | 1.5 | 2.2 | 1000 | more than 1500 | more than 1500 | 800 | more than 1000 | more than 1000 |
| Comparative example | 8 | 1.6 | 2.2 | 1250 | more than 1500 | more than 1500 | 700 | more than 1000 | more than 1000 |
| Comparative example | 9 | 2.5 | 3.2 | more than 1500 | more than 1500 | 950 | more than 1000 | more than 1000 | 750 |

Furthermore, the thermal stress durability of the test samples shown in Table 2 was evaluated. The evaluation of the thermal stress durability was made using the samples which are the semiconductor packages alone and the semiconductor packages mounted on the packaging boards. The semiconductor packages alone were applied to a heat cycle test in which a basic cycle when the samples are held for 30 minutes at a temperature of −65° C. and then held for 30 minutes at a temperature of +150° C. is repeated a predetermined number of times. Also, the samples which are the semiconductor packages mounted on the packaging board were applied to a heat cycle test in which a basic cycle when the samples are held for 30 minutes at a temperature of −45° C. and then held for 30 minutes at a temperature of +125° C. is repeated a predetermined number of times. Then the opens of electric connection, that is, the cycle numbers of break occurrences, of each sample were evaluated. The transition time when the temperature of the samples changes from the low temperature (−65° C. or −40° C.) to the high temperature (+150° C. or +125° C.) and the transition time when the temperature of the samples changes from the high temperature to the low temperature were suitably adjusted according to the capability of the heat cycle tester and the heat capacity of the samples.

As to the evaluation of the thermal stress durability of the semiconductor devices, when the heat cycle test is conducted under actual-use conditions (a temperature of 25° C. to 70° C.), it takes a long time to perform the test. Because of this, the accelerated test is conducted in a manner that the heat cycle using the temperatures of (−65° C. to 150° C.) or the temperatures of (−40° C. to 125° C.) is applied to the samples. Referring to values determined by using the Coffin-Manson formula presented in EIAJ-ET-7404 (established in April, The evaluation result of the thermal-stress durability testing is given in Table 3. The terms "Via Open at Section A" and "Via Open at Section B" given in Table 3 refer to the occurrence of opens at the via hole junctions each included in Section A and Section B as shown in FIG. 14. Also, the term "Wire Open" refers to the occurrence of opens at the junction of the wire 30, which gives electric connection to the semiconductor device 15b as shown in FIG. 14, and the etching barrier layer 5 which is provided on the wiring board 21. Furthermore, the numeric values "more than 1500" and "more than 1000" refer to cases where no open has occurred after the heat cycles at 1500 cycles and 1000 cycles respectively.

The samples No. 1 to 5 shown in Tables 2 and 3 are the embodiments of the invention. In the samples according to the embodiments, since the coefficients of thermal expansion in the direction of thickness thereof are 90 ppm/K or less, no open occurred at the via hole junctions in Sections A where the bump 14, the via holes 10 and 24, and the solder ball 24 were vertically aligned, so that the thermal stress durability thereof was excellent. Furthermore, in the samples according to the embodiments, the elastic modulus of the insulating films at a temperature of 23° C. are 5 GPa or more, the elastic modulus of the insulating films at a temperature of 150° C. are 2.5 GPa or more, the breaking strengths of the insulating films at a temperature of 23° C. are 140 MPa or more, the values of the ratio ($D_{-65}/D_{150}$) are 3.0 or less, and the values of the ratio ($H_{-65}/H_{150}$) are 2.3 or less, so that no open occurred at the wire bonding junctions, and the thermal stress durability of the entire semiconductor packages was excellent.

Figure 1:
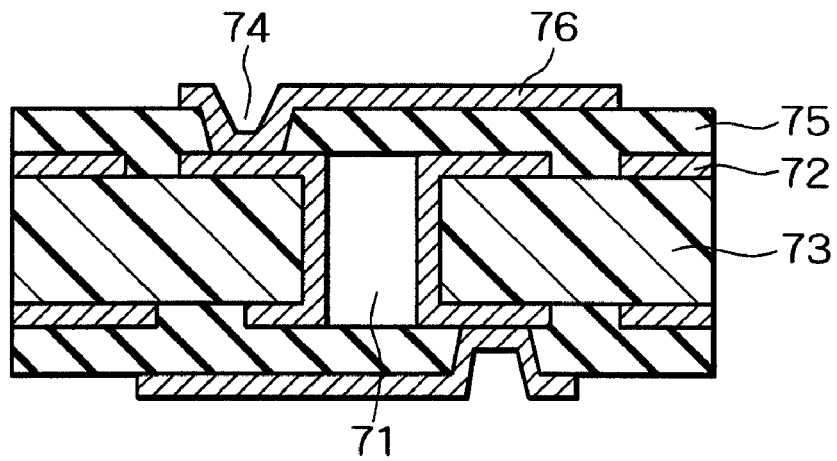
FIG. 1 is a cross-sectional view showing a conventional build-up substrate.
Figure 2A:
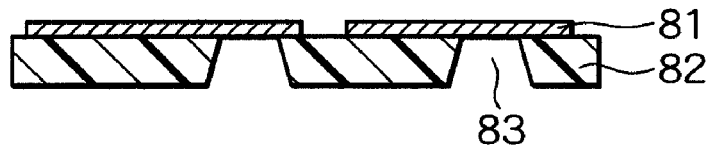
FIG. 2A to FIG. 2C are cross-sectional views showing a conventional manufacturing method of a printed board in the order of its forming steps.
Figure 2B:
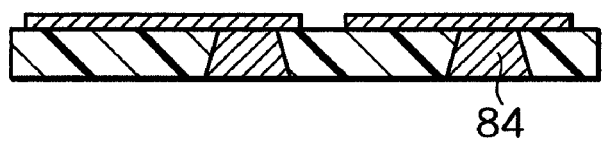
Figure 2C:
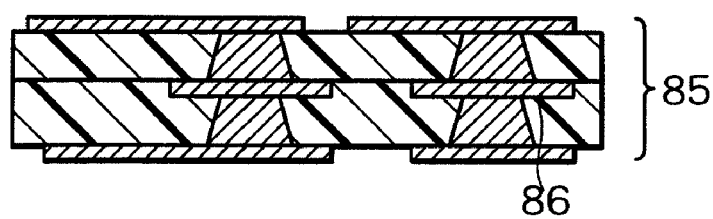

In contrast, the samples NO. 6 to 9 shown in FIGS. 2 and 3 are comparative examples. Since the comparative examples No. 6 to 8 have coefficients of thermal expansion in the directions of their thickness of more than 90 ppm/K, no open occurred at the via hole junctions included in Sections B, but opens occurred at the via hole junctions in Sections A where the bump 14, the via holes 10 and 24, and the solder ball 24 were vertically aligned, so that their thermal stress durability was poor. In contrast, since the comparative example 9 has a coefficient of thermal expansion in the direction of its thickness of 90 ppm/K or less, no open occurred at the via hole junctions included in Sections A and B. However, since the comparative example 9 does not meet the requirements that the elastic modulus of the insulating film at a temperature of 23° C. is 5 GPa or more, the elastic modulus at a temperature of 150° C. is 2.5 GPa or more, the breaking strength at a temperature of 23° C. is 140 MPa or more, the value of the ratio ($D_{-65}/D_{150}$) is 3.0 or less, and the value of the ratio ($H_{-65}/H_{150}$) is 2.3 or less, its wire bonding property and ease in handling during semiconductor package assembly are poor. Because of this, opens occurred at the wire bonding junctions, so that the thermal stress durability of the entire semiconductor package was poor.

What is claimed is:

1. A wiring board comprising:
   a base insulating film which has a thickness of 20 to 100 μm and in which via holes are formed;
   a lower wiring which is formed on the under surface of said base insulating film and which is connected to said via holes; and
   an upper wiring which is formed on said base insulating film and which is connected to said lower wiring through said via holes,
   said base insulating film being composed of a heat-resistant resin, which has a glass-transition temperature of 150° C. or higher and which contains reinforcing fibers made of glass or aramid, and having the following physical properties (1) to (6) when an elastic modulus at a temperature of T° C. is given as $D_T$ (GPa), and when a breaking strength at a temperature of T° C. is given as $H_T$ (MPa)
   (1) A coefficient of thermal expansion in the direction of thickness thereof is 90 ppm/K or less
   (2) $D_{23} \geqq 5$
   (3) $D_{150} \geqq 2.5$
   (4) $(D_{-65}/D_{150}) \leqq 3.0$
   (5) $H_{23} \geqq 140$
   (6) $(H_{-65}/H_{150}) \leqq 2.3$.

2. The wiring board according to claim 1, wherein said reinforcing fiber has a diameter of 10 μm or smaller.

3. The wiring board according to claim 1, further comprising one or more wiring structure layers, each of said wiring structure layers comprising:
   an intermediate wiring placed between said base insulating film and said upper wiring and connected to said lower wiring through said via holes; and
   an intermediate insulating film which is formed so as to cover said intermediate wiring and in which other via holes connecting said intermediate wiring to said upper wiring are formed.

4. The wiring board according to claim 1, wherein a concave portion is formed on the under surface of said base insulating film, and said lower wiring is embedded in said concave portion.

5. The wiring board according to claim 4, wherein the under surface of said base insulating film and the under surface of said lower wiring are made coplanar.

6. The wiring board according to claim 5, further comprising a protective film which is formed under said base insulating film, cover a part of said lower wiring, and exposes the remainder of said lower wiring.

7. The wiring board according to claim 1, further comprising a solder resist layer which covers a part of said upper wiring and exposes the remainder of said upper wiring.

8. A semiconductor package comprising:
   the wiring board according to claim 1; and
   a semiconductor device mounted on said wiring board.

9. The semiconductor package according to claim 8, wherein said semiconductor device is connected to said lower wiring.

10. The semiconductor package according to claim 8, wherein said semiconductor device is connected to said upper wiring.

11. The semiconductor package according to claim 8, further comprising a connecting terminal which is used for connection to external device and is connected to said upper wiring or said lower wiring.

* * * * *